United States Patent [19]

Ham et al.

[11] Patent Number: 5,256,970
[45] Date of Patent: Oct. 26, 1993

[54] MAGNETIC RESONANCE APPARATUS

[75] Inventors: Cornelis L. G. Ham; Wilhelmus R. M. Mens, both of Eindhoven, Netherlands

[73] Assignee: U.S. Philips Corporation, New York, N.Y.

[21] Appl. No.: 797,847

[22] Filed: Nov. 26, 1991

[30] Foreign Application Priority Data

Nov. 27, 1990 [NL] Netherlands ............. 9002574

[51] Int. Cl.⁵ .................................. G01V 3/00
[52] U.S. Cl. .................................. 324/318; 324/319
[58] Field of Search ............. 324/300, 307, 309, 318, 324/319, 320

[56] References Cited

U.S. PATENT DOCUMENTS 4,689,591 8/1987 McDougall .................... 324/319
4,878,023 10/1989 Overweg et al. ............... 324/318
4,878,024 10/1989 Overweg et al. ............... 324/319

FOREIGN PATENT DOCUMENTS 0187691 7/1986 European Pat. Off. .
0304126 2/1989 European Pat. Off. .
0432850 6/1991 European Pat. Off. .

Primary Examiner—Louis Arana
Attorney, Agent, or Firm—Jack D. Slobod

[57] ABSTRACT

In a magnetic resonance apparatus, a coil system is added to a gradient coil system, as a result of which a measuring field range is adapted to the geometry of an object to be examined. For example, by addition of a Bo coil system to be activated simultaneously with the z-gradient system, an asymmetry is realized in the z-gradient field, as a result of which return of disturbing resonance signals from an object part located outside the gradient field operating range is avoided. Further, by addition of additional arc conductors, the z-gradient linearity range is displaced in the z-direction.

17 Claims, 2 Drawing Sheets

MAGNETIC RESONANCE APPARATUS

FIELD OF THE INVENTION

The invention relates to a magnetic resonance apparatus comprising a magnet for producing a stationary magnetic field and a gradient coil system.

BACKGROUND OF THE INVENTION

Such a magnetic resonance apparatus is known from U.S. Pat. No. 4,878,023. In an apparatus described therein, in a measuring space within the magnet for producing magnetic resonance images both a spatial and a temporal stationary magnetic field are applied as gradient fields. For producing gradient fields in more strongly advanced high resolution resonance image forming techniques, strong, rapidly switcheable gradient fields are desired.

As a result, an increasing power is necessary for the gradient amplifiers to be used. The power of the gradient coil supply can be reduced by using gradient coils having a smaller diameter. Such a coil system is then not suitable for total body imaging, however, because too large a part of the human population does not fit into such a coil. For peripheral body parts, however, a smaller coil system is suitable, but in this case at the transition to the trunk of the patient problems frequently occur with respect to the gradient field linearity, as a result of which the imaging is adversely affected.

SUMMARY OF THE INVENTION

A first object of the invention is to obviate the said disadvantages and for this purpose a magnetic resonance apparatus of the kind mentioned in the opening paragraph is characterized in that coil arc conductors for producing a gradient field distribution adapted to the geometry of the objects to be examined are added to the gradient coil system, which coil arc conductors are driven in synchronism with the x, y- and z-axis coils of the gradient coil system.

A gradient field to be generated with a coil system according to the invention establishes a spatial encoding, as a result of which refolding from parts of an object to be examined located outside a working region to such parts located inside such a region is avoided. The additional field generated, such as an additional Bo field, comprises higher order terms which properly designed can be used for locally homogenizing the main fields.

In a preferred embodiment according to the invention, added coil arc conductors which may be real added coils or may be integrated in the gradient coil system for the relevant axis, constitute a magnet coil for producing an additive Bo field that can be activated in synchronism with a z-gradient coil system. More particularly, a Bo field coil for the additive Bo field can be activated by a drive proportional to the z-gradient coil drive and is for this purpose connected in a preferred embodiment in series with a z-gradient coil system or is integral therewith. Due to the additive Bo field switched in synchronism with the z-gradient field, it is then prevented that resonance signals produced in a body part not selected by a suitable Larmor frequency are taken into account in the image formation during refolding. Thus, for example, with a desired image of a region located in the neck/throat area, it can be prevented that subregions of the trunk would also be included in a disturbing manner in the image formation. Of course no disturbing resonance signals can originate from the empty region in the magnet. In electromagnetic coil systems that may be superconducting, the z-axis usually coincides with the axis of rotation of the coils and a longitudinal direction of an object to be examined will usually also coincide therewith. This geometry is not true, for example, in magnet systems of permanent magnetic material and magnet systems with a magnetic field produced between pole pieces, but the z-axis also means here a longitudinal direction of the object to be examined.

In a further preferred embodiment, additive arc conductors are designed to obtain an axial displacement of a linearity region in the z-gradient field from the center of the stationary field magnet. Such a displacement is also obtained with the additional Bo field coil and has the advantage that with the same geometric positioning of a patient in the coil system the measuring range of the coil system can be inserted further into a transitional region between periphery and trunk.

In a further preferred embodiment, the gradient coil system is equipped with shielding coil systems. Shielding arc conductors can be located in the gradient coil system such that a comparatively short coil system with a preferred location of the linearity trajectory in for example the z-direction can be obtained. Thus an asymmetrical coil system can be realized. Particularly a z-gradient field and a Bo field will each deviate from a desired field distribution. Measured along the z-axis, this deviation may be, starting from the center ($z=0$) of the magnet system, both increasing and decreasing. By a suitable choice of the size and the sign of the deviation of the gradient field and that of the Bo field, a linearity range in the z-direction can be shifted in the direction of an object to be examined. The extent of the linearity range can then remain unchanged.

In a further preferred embodiment, a gradient coil system is composed of segments, which can be stacked radially, are provided with arc-shaped conductors (hereinafter referred to as "arc conductors") and have openings for radially directed conductor parts. Such a construction permits of building up a gradient magnet system by a stacking of coil parts building up from the inside and hence readily accessible, while in a simple manner also the desired electrical connections can be established.

A gradient magnet system according to the invention can form constructively an integral part of the stationary field magnet and can consequently be mounted, for example, on an inner side thereof or on a transverse wall thereof, but may be also constructed for specific examinations also as an insert coil system.

DESCRIPTION OF THE PREFERRED EMBODIMENTS

Figure 1:
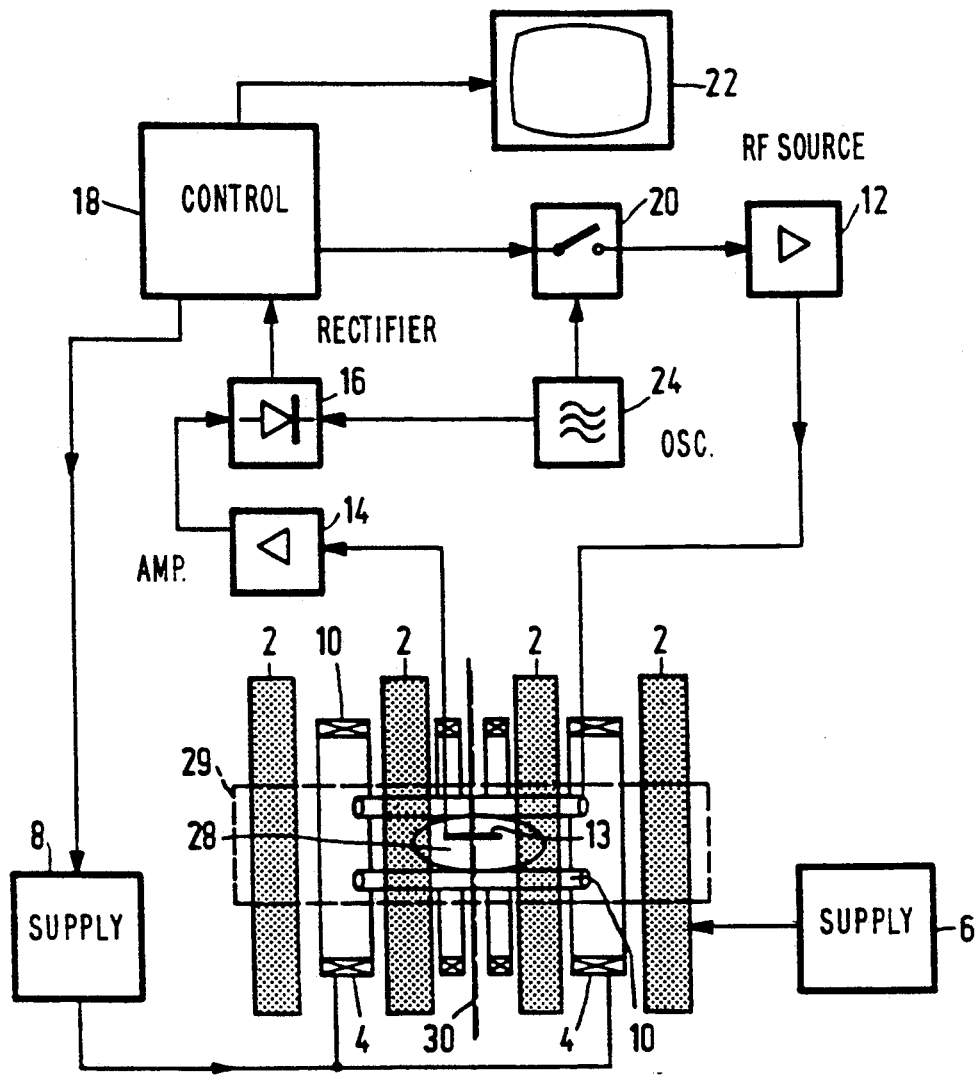
FIG. 1 shows a magnetic resonance apparatus according to the invention.

A magnetic resonance apparatus of the kind shown in FIG. 1 comprises a magnet system 2 for producing a stationary homogeneous main magnetic field Bo, a magnet system 4 for producing magnetic gradient fields, supply sources 6 and 8 for the magnet system 2 and the magnet system 4, respectively. A magnet coil 10 serving to produce a rf magnetic alternative field connected to a radio-frequency source 12 can serve at the same time to detect magnetic resonance signals produced by the rf transmission field in an object to be examined and is connected for this purpose to a signal amplifier 14. The signal amplifier 14 is connected to a phase-sensitive rectifier 16, which is connected to a central control device 18. The central control device 18 further controls a modulator 20 for the radio-frequency source 12, the supply source 8 for the gradient coils and a monitor 22 for image production. A high-frequency oscillator 24 controls both the modulator 20 and the phase-sensitive rectifier 16 processing measuring signals. The transmitter coil 10 arranged within the magnet systems 2 and 4 encloses a measuring space 28, which in an apparatus for medico-diagnostic measurements offers sufficient space for accommodation of patients. In the measuring space 28, a stationary magnetic field, gradient fields for position selection of cross-sections to be imaged and a spatial homogeneous radio-frequency alternating field can thus be produced.

A gradient magnet system 4 is usually symmetrical with respect to a radial plane of symmetry 30, which therefore also subdivides the measuring space symmetrically into two parts and is directed through a point $z=0$ transverse to a z-axis of the magnet system. The stationary magnetic field produced by the stationary magnet system is directed in this case along the z-axis. A gradient magnet system in a magnetic resonance apparatus usually comprises for each of the coordinate directions a coil system, by whose activation the gradient fields can be produced in each of these directions and a pointwise image of an object can be obtained.

Figure 2:
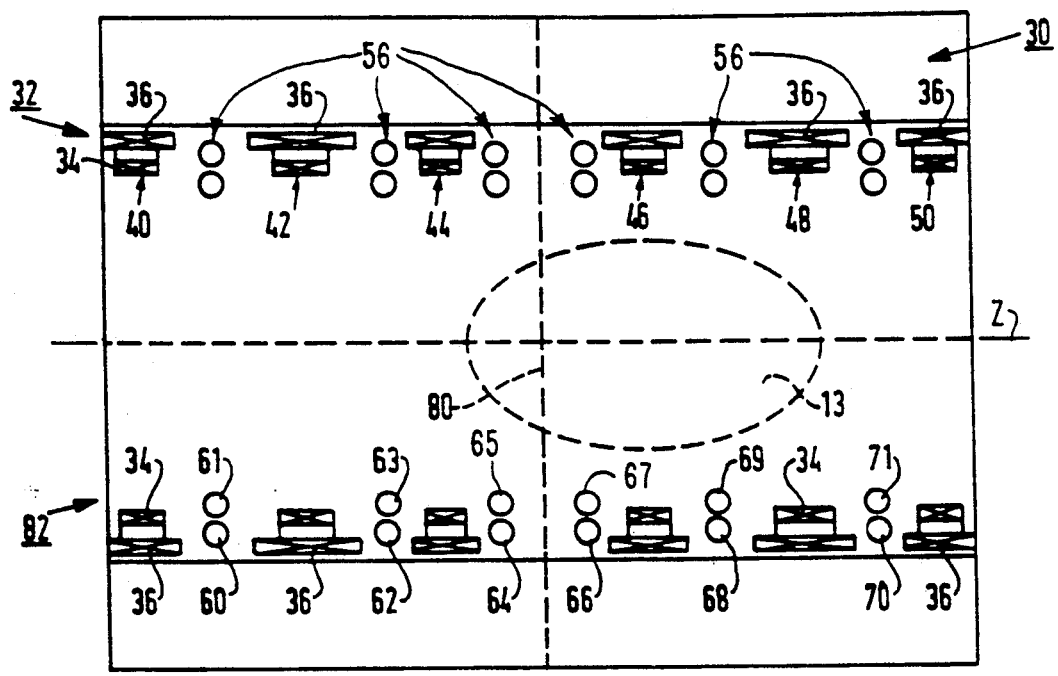
FIG. 2 shows in outline a gradient coil system for this apparatus with an additional Bo field coil.

FIG. 2 shows a magnet system for a magnetic resonance apparatus diagrammatically a combined stationary field and x- and y-gradient field magnet system 30. In this system, a z-gradient coil system 32 comprises coil packets 40, 42, 46, 48 and 50 each of which comprises an individual field arc conductor packet 34 and an individual screening arc for the additive Bo field having field arc conductor windings 61, 63, 65, 65, 67, 69 and 71 and shielding arc conductor windings 60, 62, 64, 66, 68 and 70. By having field arc conductor windings 60, 62, 66, 68 and 70 and shielding return conductors 61, 63, 65, 67, 69 and 71 respectively between the packets 34, 36 of coil packets 40-50. By means of such a system, a stationary magnetic field and gradient fields are produced in a measuring range within the magnet in three orthogonal directions. Due to the fact that the Bo field coil system 56 is activated in proportion to the activation of the z-gradient coil, e.g. by being electrically connected in series with the z-gradient coil, the z-gradient field is shifted in the z-direction, as a result of which an asymmetry of the z-gradient field with respect to an axial coil symmetry plane 80 is obtained. With a patient introduced, for example, from a side 82, return of resonance signals will not occur because of an excessively high Larmor frequency due to the increased field in situ. A reverse part 83 of the system remains empty so that from there no resonance signals can be recorded, even if the Larmor frequency would lie there indeed within the adjusted trajectory, because no resonance signals at all are produced there. The Bo coil system 56, rather than being formed by real added windings 60-71, may instead be integrated in the z-gradient coil by the addition of arc conductors to the winding packets on one end and the omission of arc windings from the packets at the opposite end. Shifts of the linearity region in the x- and y-direction can be introduced on a similar manner if appropriate.

A head-neck insert coil system comprises, for example, whether or not integrated a shielded x-gradient coil system, a shielded y-gradient coil system and a shielded z-gradient coil system with a screened Bo field coil system. In order to shift the linearity range of such a coil system, especially in the z-direction, the coil system may be provided with additional conductors for example with an arc conductor, with radial conductors for transition to conductors having another diameter, and with shielding arc conductors for the z-gradient coil. Thus the z-linearity trajectory can be considerably shifted.

We claim:

1. A magnetic resonance apparatus comprising a magnet for producing a uniform magnetic field in a z direction in a space for receiving a region of an object to be examined and a gradient coil system comprising a plurality of field arc conductors forming a z-gradient coil for selectively producing a z-gradient magnetic field in said space directed in said z direction and having a linearity range in said z direction, x-gradient and y-gradient coils for selectively producing x-gradient and y-gradient magnetic fields in said space directed in said z direction and having respective linearity ranges in mutually orthogonal x and y directions which are mutually orthogonal to said z direction, and a further coil for producing an additive uniform magnetic field directed in the z direction in said space, said further coil being adapted to be selectively driven in synchronism with a drive of at least one of the gradient coils formed by said coil system, whereby the linearity range of said at least one of the gradient coils is selectively displaced in said space.

2. A magnetic resonance apparatus as claimed in claim 1, wherein said further coil is adapted to be selectively driven in synchronism with said at least one of the gradient coils by a series arrangement of said further coil and said at least one of said gradient coils.

3. A magnetic resonance apparatus as claimed in claim 1, wherein said at least one gradient coil is said z-gradient coil.

4. A magnetic resonance apparatus as claimed in claim 1, wherein said further coil is adapted to be selectively driven in synchronism with any selected one of said gradient coils, whereby the linearity range of said selected one of the gradient coils is selectively displaced in said space.

5. A magnetic resonance apparatus as claimed in claim 4, wherein said further coil is adapted to be selectively driven in synchronism with any selected one least one of the gradient coils by a series arrangement of said further coil and said selected one of said gradient coils.

6. A magnetic resonance apparatus as claimed in claim 1, wherein said coil system further comprises return arc conductors adapted to be driven for actively shielding said field arc conductors.

7. A magnetic resonance apparatus as claimed in claim 5, wherein said coil system further comprises return arc conductors adapted to be driven for actively shielding said field arc conductors.

8. A magnetic resonance apparatus as claimed in claim 1, wherein said coil system is integral with said magnet.

9. A magnetic resonance apparatus as claimed in claim 1, wherein the arc conductors forming said additional coil are integrated with the arc conductors forming said z-gradient coil.

10. A gradient coil system for magnetic resonance apparatus, said gradient coil system comprising a plurality of field arc conductors forming a z-gradient coil for selectively producing a z-gradient magnetic field in said space directed in a z direction and having a linearity range in said z direction, x-gradient and y-gradient coils for selectively producing x-gradient and y-gradient magnetic fields in said space directed in said z direction and having respective linearity ranges in mutually orthogonal x and y directions which are mutually orthogonal to said z direction, and a further coil for producing a uniform magnetic field directed in the z direction in said space, said further coil being adapted to be selectively driven in synchronism with a drive of at least one of the gradient coils formed by said coil system, whereby the linearity range of said at least one of the gradient coils is selectively displaced in said space.

11. A gradient coil system as claimed in claim 10, wherein said further coil is adapted to be selectively driven in synchronism with said at least one of the gradient coils by a series arrangement of said further coil and said at least one of said gradient coils.

12. A gradient coil system as claimed in claim 10, wherein said at least one gradient coil is said z-gradient coil.

13. A gradient coil system as claimed in claim 10, wherein said further coil is adapted to be selectively driven in synchronism with any selected one of said gradient coils, whereby the linearity range of said selected one of the gradient coils is selectively displaced in said space.

14. A gradient coil system as claimed in claim 13, wherein said further coil is adapted to be selectively driven in synchronism with any selected one least one of the gradient coils by a series arrangement of said further coil and said selected one of said gradient coils.

15. A gradient coil system as claimed in claim 10, wherein said coil system further comprises return arc conductors adapted to be driven for actively shielding said field arc conductors.

16. A gradient coil system as claimed in claim 14, wherein said coil system further comprises return arc conductors adapted to be driven for actively shielding said field arc conductors.

17. A gradient coil system as claimed in claim 10, wherein the arc conductors forming said additional coil are integrated with the arc conductors forming said z-gradient coil.

* * * * *